(12) United States Patent
Leibfritz

(10) Patent No.: US 9,903,932 B2
(45) Date of Patent: Feb. 27, 2018

(54) MEASURING SYSTEM, CALIBRATION DEVICE AND MEASURING METHOD WITH UNCERTAINTY ANALYSIS

(71) Applicant: Rohde & Schwarz GmbH & Co. KG, Munich (DE)

(72) Inventor: Martin Leibfritz, Aying (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 157 days.

(21) Appl. No.: 14/961,788

(22) Filed: Dec. 7, 2015

(65) Prior Publication Data

US 2017/0160369 A1    Jun. 8, 2017

(51) Int. Cl.
   *G01R 35/00* (2006.01)
   *G01R 27/28* (2006.01)
   *G01R 31/319* (2006.01)
   *G01R 27/00* (2006.01)

(52) U.S. Cl.
   CPC ........... *G01R 35/005* (2013.01); *G01R 27/28* (2013.01); *G01R 31/3191* (2013.01); *G01R 27/00* (2013.01); *G01R 35/00* (2013.01)

(58) Field of Classification Search
   CPC .... G01R 35/00; G01R 35/005; G01R 35/007; G01R 33/00; G01R 33/0023; G01R 33/0035; G01R 31/00; G01R 31/28; G01R 31/317; G01R 31/3181; G01R 31/319; G01R 31/31903; G01R 31/319038; G01R 31/3191; G01R 27/00; G01R 27/28
   USPC .............. 324/600, 601, 200, 202, 500, 537, 324/750.01, 750.02, 74, 76.11, 130; 702/85
   See application file for complete search history.

(56) References Cited

U.S. PATENT DOCUMENTS

| 4,853,613 A | 8/1989 | Sequeira et al. |
| 5,332,974 A | 7/1994 | Harkins et al. |
| 6,570,397 B2 * | 5/2003 | Mayder ................ G01R 31/319 324/750.02 |
| 8,612,177 B2 | 12/2013 | Hiebel et al. |
| 2008/0018342 A1 * | 1/2008 | Hiebel ................... G01R 27/28 324/601 |
| 2017/0146632 A1 * | 5/2017 | Wadell ............... G01R 1/07342 |

* cited by examiner

*Primary Examiner* — Hoai-An D Nguyen
(74) *Attorney, Agent, or Firm* — Potomac Technology Law, LLC

(57) ABSTRACT

A calibration apparatus, for calibration of a measurement device, is provided. The calibration apparatus includes a calibration device configured to calibrate the measurement device. The calibration device also includes a verificationH device configured to verify the calibration of the measurement device. The calibration device also includes a switch configured to switch between a connection of the measurement device to the calibration device and a connection of the measurement device to the verification device.

20 Claims, 7 Drawing Sheets

MEASURING SYSTEM, CALIBRATION DEVICE AND MEASURING METHOD WITH UNCERTAINTY ANALYSIS

FIELD

The invention relates to a calibration device, a measuring system using a calibration device and a measuring method, and more specifically performing calibration operations.

BACKGROUND

For achieving a high measuring accuracy, it is necessary to calibrate measuring devices, for example vector network analyzers. To perform such a calibration, successively, a number of calibration standards are connected to the measuring ports of the measuring device. After the calibration measurements are complete, the measuring device is calibrated based upon results of the calibration measurement.

When using a calibrated measuring device, in the ideal case, measured values are identical to the actual value. In practice, however, a number of effects lead to remaining measurement uncertainties. Further, the user is unaware of the existence or value of such measurement uncertainties when performing measurements with, what is believed to be, a calibrated measuring device, which is disadvantageous, since the user could rely on measuring results which actually are far less accurate than expected.

The document U.S. Pat. No. 8,612,177 B2 shows a measuring device which tries to mitigate the above-described problem by theoretically calculating a measurement uncertainty and displaying it along with measuring results. The calculated measurement uncertainty though is very inaccurate and does not take the individual measuring device and measuring setup into account. The user therefore cannot rely on the displayed measurement uncertainty. On the one hand, the actual measurement uncertainty might be significantly lower than displayed, which leads the user not to trust the measuring results. On the other hand, the displayed measurement uncertainty might be too low. This leads the user to falsely trust the measuring results although the actual measurement uncertainty is larger.

What is therefore needed is a calibration approach for a measuring device, such as a vector network analyzer, that eliminates measurement uncertainties.

SUMMARY

Embodiments of the present invention advantageously address the foregoing requirements and needs, as well as others, by providing calibration approaches (such as calibration devices and associated calibration processes) for a measuring device, such as a vector network analyzer, that eliminates measurement uncertainties.

In accordance with example embodiments, a calibration apparatus, for calibration of a measurement device, is provided. The calibration device comprises a calibration device configured to calibrate the measurement device. The calibration device further comprises a verification device configured to verify the calibration of the measurement device. The calibration device further comprises a switch configured to switch between a connection of the measurement device to the calibration device and a connection of the measurement device to the verification device. It is thereby possible to first perform a calibration using the calibration unit and to afterwards verify the calibration using the verifying unit, thereby determining a measurement uncertainty.

According to a further embodiment of the calibration apparatus, the calibration unit comprises a through connection and three or more different calibration standards. An accurate calibration is thereby possible.

According to a further embodiment of the calibration apparatus, the verification unit comprises a verification through connection and at least three different verification standards. An accurate verification and thereby an accurate determining of a measurement uncertainty is then possible. By way of example, the impedances of the three different verification standards are predefined by their geometry and/or material selection. It is thereby possible to calculate the expected standard's response on the basis of this input data. This is commonly referred to as a traceable standard.

According to a further embodiment of the calibration apparatus, the verification unit comprises two attenuators of known attenuation and two verification lines of different and known impedance. An alternative construction layout leading to a high verification accuracy is thereby provided. By way of example, the attenuations of the two attenuators are predefined by their geometry and/or material selection. It is thereby very easily possible to calculate the expected standard's response on the basis of this input data. This is commonly referred to as a traceable standard.

In accordance with further example embodiments, a measuring system is provided. The measuring system comprises a measurement device and a calibration apparatus. The calibration apparatus comprises a calibration device configured to calibrate the measurement device, a verification device configured to verify the calibration of the measurement device, and a switch configured to switch between a connection of the measurement device to the calibration device and a connection of the measurement device to the verification device. It is thereby possible to perform a calibration of the vector network analyzer.

According to a further embodiment of the measuring system, the calibration apparatus is configured to perform a calibration measurement on the calibration device, using the measurement device, calibrate the measurement device based on the calibration measurement, switch to the verification device by means of the switch, and perform a verification measurement on the verification device, using the measurement device. It is thereby possible to automatically perform the calibration and verification process. By way of example, the measurement device is configured to, when a measurement on a device under test is to be performed, determine a measurement uncertainty of the measurement to be performed based on results of the verification measurement. It is thereby possible to allow a user to judge the actual measurement uncertainty. By way of further example, the measurement device is configured to, when a measurement on a device under test is to be performed, determine the measurement uncertainty of the measurement to be performed based further on parameters of the measurement to be performed. An accurate determining of the measurement uncertainty is thereby possible. By way of further example, the measurement device comprises a display unit, and wherein the measurement device is configured to display the measurement uncertainty on the display unit. A user can thereby very easily judge the actual measurement uncertainty of a present measurement. By way of further example, when a measurement on a device under test is to be performed, the measurement device is configured to perform the measurement, display measurement results of the measurement on the display as a graph, and display the measurement uncertainty as one or more of a pattern, color and/or shading, an uncertainty area around the graph, and a shape attached to the graph. It is thereby possible for a user to easily ascertain the amount of measurement uncertainty of a specific measurement.

According to a further embodiment of the measuring system, the measurement device is configured to calibrate the vector network analyzer based on the calibration measurement, whereby a directivity becomes approximately zero, a source-match becomes approximately zero, and a reflection tracking becomes approximately one. An accurate calibration is thereby achieved.

According to a further adaptation of the previous preferred implementation, the vector network analyzer is configured to determine an effective directivity, an effective source-match, and an effective reflection tracking based on the verification measurement. The vector network analyzer is then moreover configured to determine the measurement uncertainty based upon the effective directivity, the effective source-match and the effective reflection tracking. An especially accurate determining of the measurement uncertainty is thereby possible. By way of example, the measurement device is configured to determine an effective directivity, an effective source-match, and an effective reflection tracking based on the verification measurement, and determine the measurement uncertainty based on the effective directivity, the effective source-match, and the effective reflection tracking.

In accordance with further example embodiments, a measuring method is provided. The method comprises performing, by a calibration device, a calibration measurement using a measurement device, calibrating the measurement device based on the calibration measurement, switching to a verification device, performing, by the verification device, a verification measurement using the measurement device, and determining a measurement uncertainty of a measurement to be performed on a device under test based on results of the verification measurement. It is thereby possible to accurately determine the amount of the measurement uncertainty. By way of example, the calibration of the measurement device is based on the calibration measurement, whereby a directivity becomes approximately zero, a source-match becomes approximately zero, and a reflection tracking becomes approximately one. By way of further example, the method further comprises determining an effective directivity, an effective source-match, and an effective reflection tracking based on the verification measurement, and determining the measurement uncertainty based on the effective directivity, the effective source-match, and the effective reflection tracking.

According to a further example embodiment of the measuring metod, when a measurement on a device under test is to be performed, the method further comprises determining the measurement uncertainty of the measurement to be performed based further on parameters of the measurement to be performed.

According to a further example embodiment of the measuring metod, the method comrpises displaying the measurement uncertainty on a display unit of the measurement device.

According to a further example embodiment of the measuring metod, when a measurement on a device under test is to be performed, the method further comprises performing the measurement, displaying measurement results of the measurement on a display as a graph, and displaying the measurement uncertainty as one or more of a pattern, color and/or shading, an uncertainty area around the graph, and a shape attached to the graph.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings, in which like reference numerals refer to similar elements, and in which.

DETAILED DESCRIPTION

Novel calibration approaches (such as calibration devices and associated calibration processes) are provided for a measuring device, such as a vector network analyzer, that eliminates measurement uncertainties.

Figure 1:
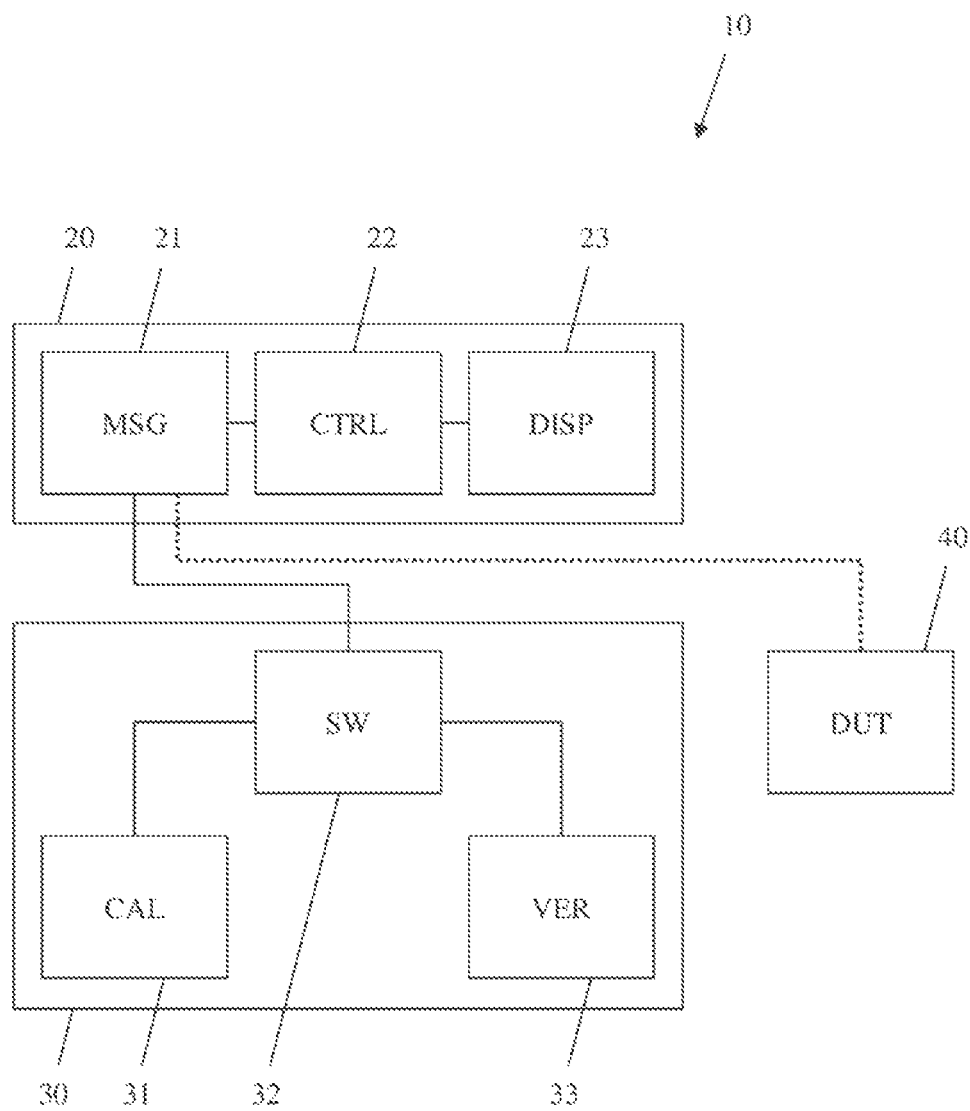
FIG. 1 shows a block diagram of a measuring system that employs a calibration device, in accordance with example embodiments.

FIG. 1 shows a block diagram of a measuring system 10 that employs a calibration device, in accordance with example embodiments of the present invention. The measuring system 10 comprises a measuring device 20, such as a vector network analyzer 20, and a calibration device 30 connected to the vector network analyzer 20. Additionally displayed here is a device under test (DUT) 40, which is not part of the measuring system 10.

The vector network analyzer 20 comprises a measuring unit 21, a control unit 22 and a display unit 23. The measuring unit 21 and the display unit 23 are each connected to the control unit 22. The control unit 22 is configured to control the measuring unit 21 and the display unit 23.

The calibration device 30 comprises a calibration unit 31, a verification unit 33 and a switch 32. The calibration unit 31 and the verification unit 33 are both connected to the switch 32. The switch 32 is connected to the measuring unit 21 of the vector network analyzer 20.

By way of example, in performing a calibration, the measuring unit 21 is connected to the calibration unit 31 by the switch 32. The measuring unit 21 initiates a number of calibration measurements, controlled by the control unit 22. As part of these calibration measurements, a number of calibration standards, which are included in the calibration unit 31 are successively connected to the measuring unit 21 and measured. Details of the construction of the calibration unit 31 are provided below with reference to FIG. 2. Results of these calibration measurements are used for performing a calibration of the vector network analyzer 20. Respective calibration calculations are performed by the control units 22.

By way of further example, after the vector network analyzer 20 has been calibrated, the verification unit 33 is connected to the measuring unit 21 by the switch 32. The verification unit 33 comprises a number of verification standards, which are successively connected to the measuring unit 21 and used for a series of verification measurements. After the verification measurements have been performed, results of the verification measurements are used to determine a measurement uncertainty. Further, in determining the measurement uncertainty, parameters of a measurement to be performed on a device under test 40 can be taken into account.

By way of further example, after the calibration and verification is finished, the device under test 40 is connected to the measuring unit 21. A measurement is performed. Measuring results are displayed on the display unit 23 by the control unit 22. In addition, the measurement uncertainty is displayed on the display unit 23. The display of the measuring results and the measurement uncertainty are described below with reference to FIGS. 5a, 5b and 5c.

Figure 2:
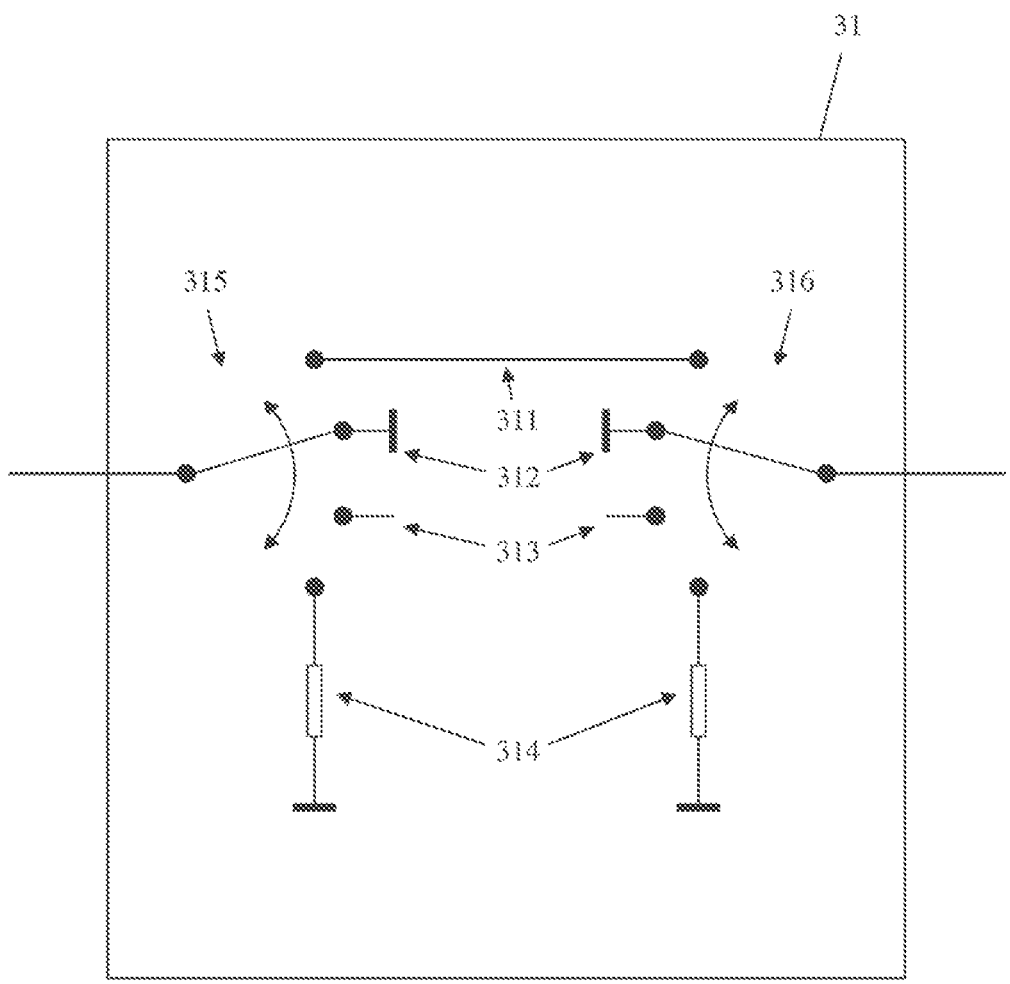
FIG. 2 shows an example of a calibration unit of the calibration device of the measuring system of FIG. 1, in accordance with example embodiments.

FIG. 2 shows an example of a calibration unit 31 of the calibration device of the measuring system of FIG. 1, in accordance with example embodiments of the present invention. The calibration unit 31 comprises a through connection 311 as a first calibration standard, a short 312 as a second calibration standard, an open 313 as a third calibration standard and a specific impedance 314 as a fourth calibration standard. The calibration unit 31 further comprises two switches 315 and 316 for switching between these different calibration standards 311-314.

By way of example, in performing a calibration, the different calibration standards 311-314 are successively connected to the measuring unit 21. The measuring unit performs a calibration measurement on each one of these calibration standards. Based upon the measuring results, a calibration is performed. Further details of the calibration are described below with reference to FIGS. 4a and 4b. By way of further example, the values of the individual calibration standards 311-314 are known. Further, the values of the calibration standards can be defined by their geometry and/or material selection, enabling a traceability and/or optimum coverage of the desired impedance range of the device under test.

Moreover, in accordance with example embodiments, the calibration unit 31 is not limited to the example calibration standards 311-314 of the embodiment depicted in FIG. 2. Also, a calibration using different and/or additional calibration standards can be employed in example embodiments. Further, a calibration using different impedances instead of the depicted short, open and match may also be employed in example embodiments.

Figure 3A:
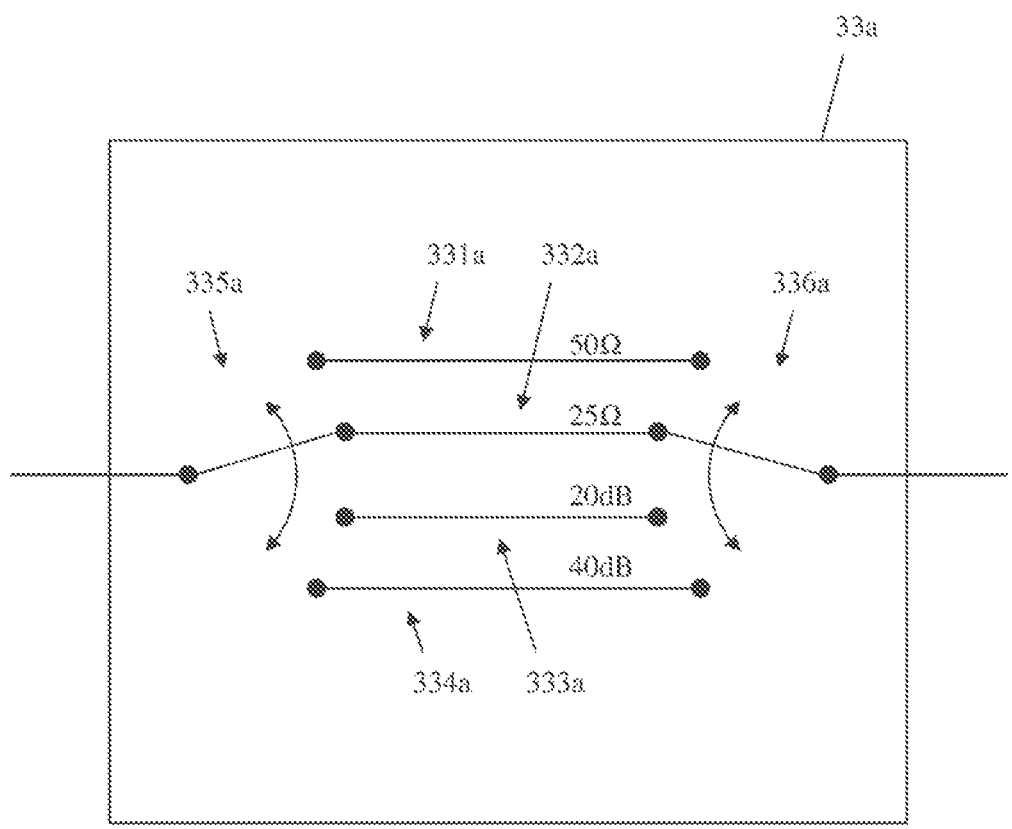
FIG. 3a shows an example of a verification unit of the calibration device of the measuring system of FIG. 1, in accordance with example embodiments.

FIG. 3a shows an example of a verification unit 33a of the calibration device of the measuring system of FIG. 1, in accordance with example embodiments of the present invention. The verification unit 33b corresponds to the verification unit 33 of FIG. 1. The verification unit 33a comprises a number of verification standards 331a-334a, and the switches 335a and 336a. The switches 335a and 336a successively switch between the individual verification standards 331a-334a and thereby connect them to the measuring unit 21. By way of example, as depicted, a first verification standard 331a is a through connection having an impedance of 50Ω, a second verification standard 332a is a through connection having an impedance of 25Ω0, a third verification standard 333a is an attenuator of 20 dB, and a fourth verification standard 334a is an attenuator of 40 dB. Further, the values of the respective verification standards 331a-334a within the verification unit 33a are known. By way of further example, the verification standards can be defined by their geometry and/or material selection, enabling a user to recreate the calibration standards himself.

Figure 3B:
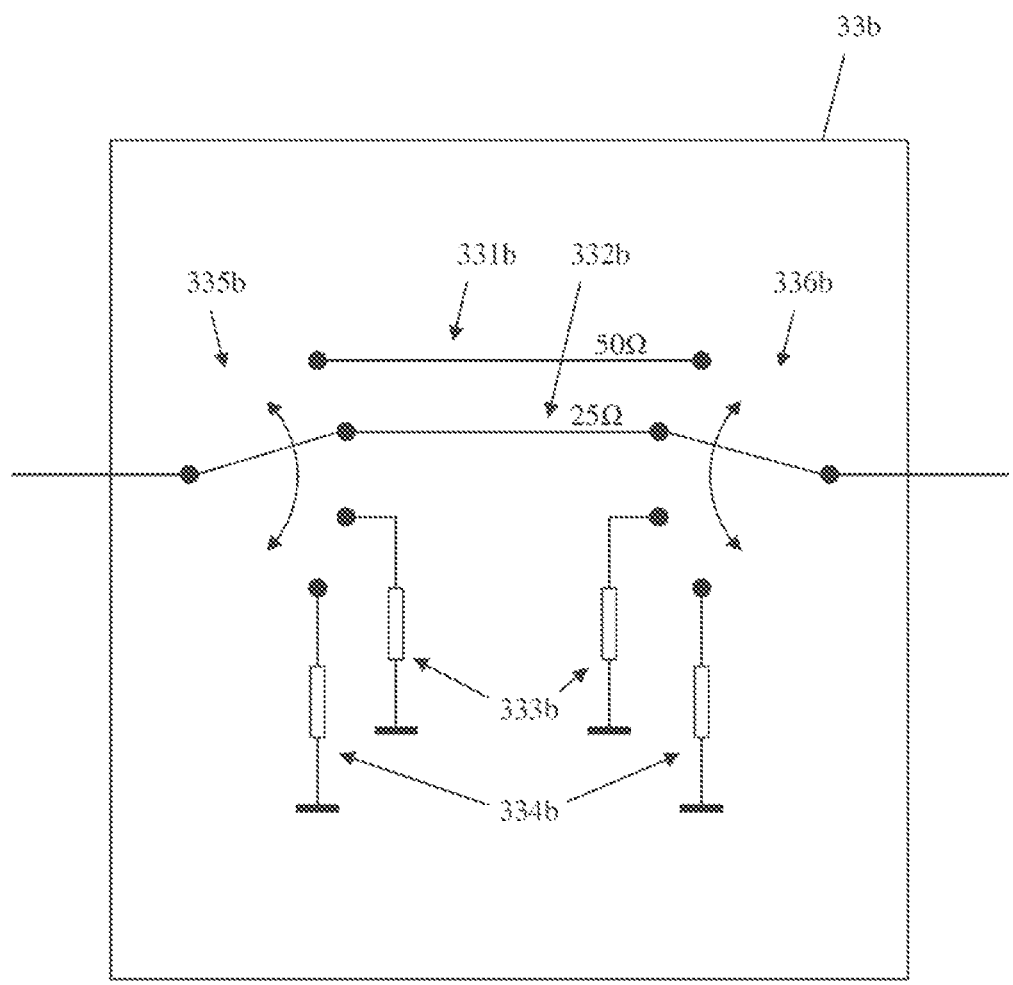
FIG. 3b shows a further example of a verification unit of the calibration device of the measuring system of FIG. 1, in accordance with example embodiments.

FIG. 3b shows a further example of a verification unit 33b of the calibration device of the measuring system of FIG. 1, in accordance with example embodiments of the present invention. The verification unit 33b corresponds to the verification unit 33 of FIG. 1. The verification unit 33b comprises a number of verification standards 331b-334b, and the switches 335b and 336b. The switches 335b, 336b successively switch between the individual verification standards 331b-334b and thereby connect them to the measuring unit 21. By way of example, as depicted, a first verification standard 331b is a through connection having an impedance of 50Ω, a second verification standard 332b is a through connection having an impedance of 25Ω, a third verification standard 333b is an impedance of a first specific value, and a fourth verification standard 334b is an impedance of a second specific value. The values of the respective verification standards 331b-334b within the verification unit 33b are known. By way of further example, the verification standards can be defined by their geometry and/or material selection, enabling a user to recreate the calibration standards himself.

Figure 4A:
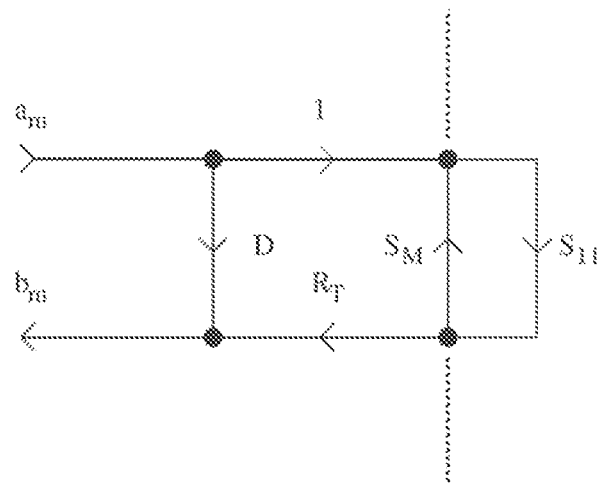
FIG. 4a shows a signal flow diagram of calibration measurement of a single measurement port before calibration, in accordance with example embodiments.
Figure 4B:
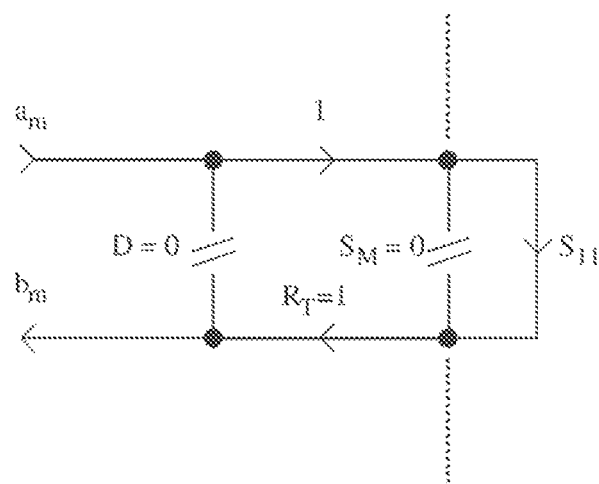
FIG. 4b shows a signal flow diagram of calibration measurement of a single measurement port after calibration, in accordance with example embodiments.

FIG. 4a shows a signal flow diagram of calibration measurement of a single measurement port before calibration, and FIG. 4b shows a signal flow diagram of calibration measurement of a single measurement port after calibration, in accordance with example embodiments of the present invention. The dashed lines show the location of the reference phase of the measurement port. The calibration of the measuring port is defined by its directivity D, a reflection tracking RT, a source match SM and the value of the calibration standard S11.

While in FIG. 4a a general setup is shown, in FIG. 4b an ideal case is shown. In a perfectly calibrated case, the effective directivity D is zero, the effective source match SM is zero and the effective reflection tracking RT is one. The ideal case of FIG. 4b, applies for calibration standards whose characteristics are known during the calibration. In practice, however, usually a remaining measurement uncertainty exists, which can be described by an effective directivity, an effective reflection tracking and an effective source match. These values are determined from the results of the verification measurement, which is possible since the verification standards within the verification unit 33 are different from the calibration standards within the calibration unit 31. From the values of the effective directivity, effective reflection tracking and effective source match, it is possible to determine the measurement uncertainty.

While FIGS. 4a and 4b depict embodiments of a single-port calibration, embodiments of the present invention are also applicable to calibrations of multiple ports. The application to two-port measuring devices or multi-port measuring devices is thus possible.

Figure 5A:
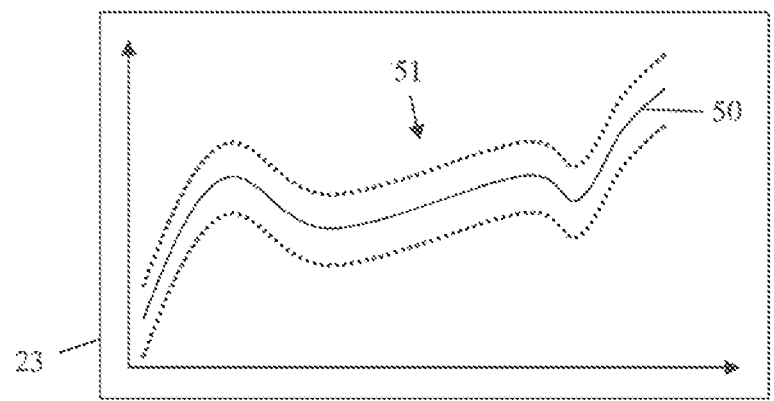
FIG. 5a shows a first example of a measurement display of a measurement system, in accordance with example embodiments.
Figure 5B:
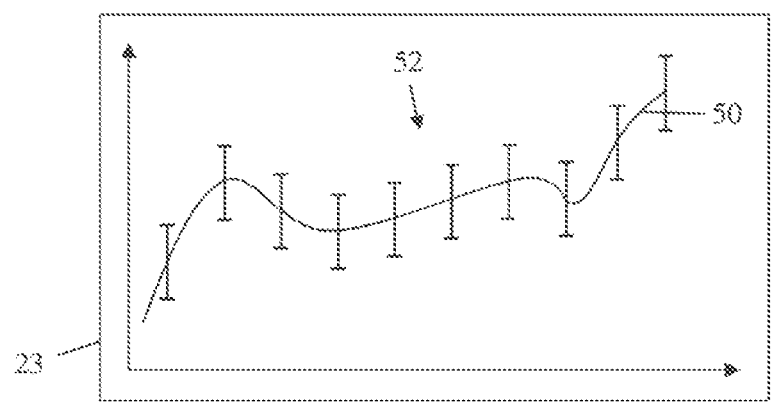
FIG. 5b shows a second example of a measurement display of a measurement system, in accordance with example embodiments.
Figure 5C:
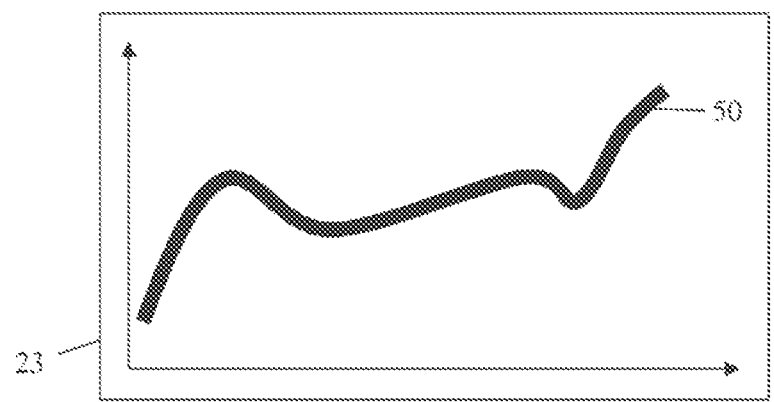
FIG. 5c shows a third example of a measurement display of a measurement system, in accordance with example embodiments.

FIGS. 5a, 5b and 5c show different options for displaying the measurement results and the measurement uncertainty.

FIG. 5a shows a first example of a measurement display of a measurement system, in accordance with example embodiments of the present invention. FIG. 5a shows a graph 50 of the measuring results. The measurement uncertainty is shown in form of two dashed lines 51 surrounding the graph 50. The actual measuring value lies between the dashed lines 51.

FIG. 5b shows a second example of a measurement display of a measurement system, in accordance with example embodiments of the present invention. In FIG. 5b, the measurement uncertainty is displayed by a number of shapes 52 attached to the graph 50. The shapes 52 indicate the measurement uncertainty.

FIG. 5c shows a third example of a measurement display of a measurement system, in accordance with example embodiments of the present invention. In FIG. 5c the measurement uncertainty is displayed by the width of the graph 50 itself. Also, a shading or a texturing of the graph 50 is possible. Moreover, the graph 50 can also be supplied with a pattern.

Figure 6:
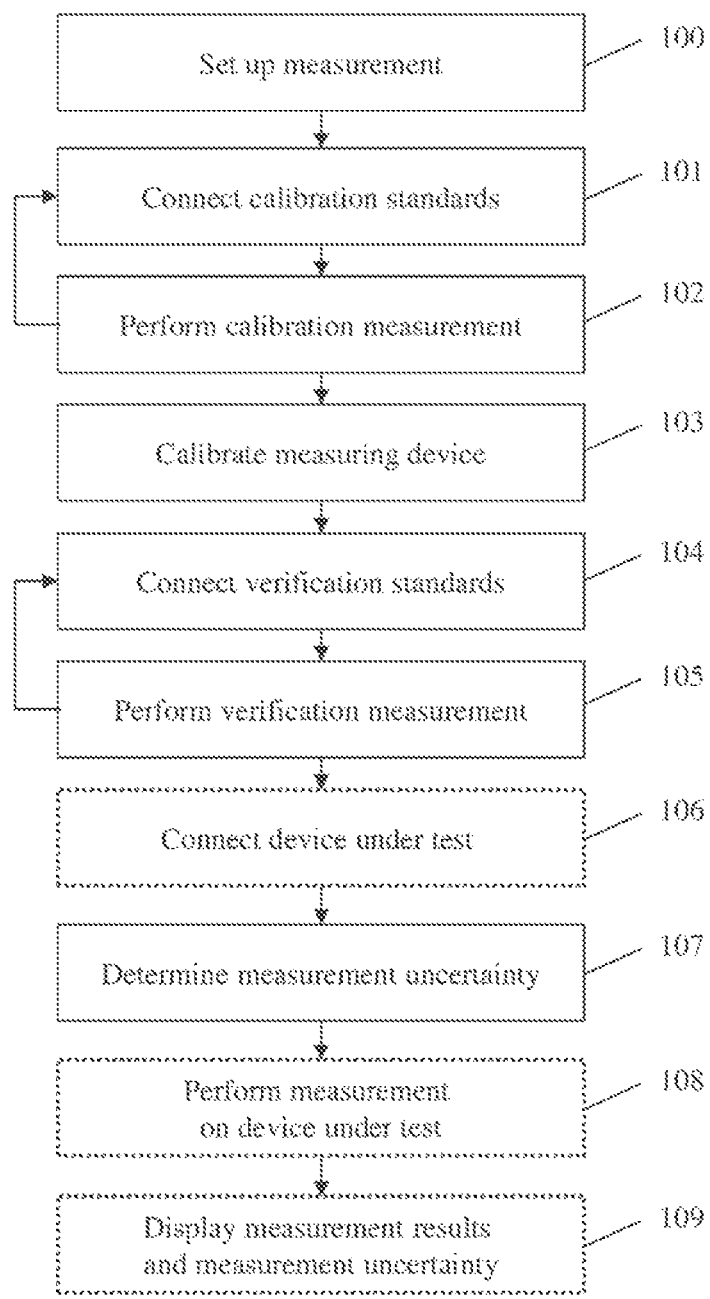
FIG. 6 shows a flow chart of a calibration process for a measurement system, in accordance with example embodiments.

FIG. 6 shows a flow chart of a calibration process for a measurement system, in accordance with example embodiments of the present invention. In a first step 100, a measurement is set up. In a second step 101, a number of calibration standards is successively connected to the measuring device. In a third step 102, calibration measurements are performed. The steps 101 and 102 are repeated, until calibration measurements of all calibration standards have been performed. In a fourth step 103, the measuring device is calibrated using the calibration measurements performed earlier.

In a fifth step 104, a number of verification standards are successively connected to the measuring device. In a sixth step 105, a verification measurement is performed on the presently connected verification standard. The steps 104 and 105 are repeated until verification measurements on all verification standards have been performed.

In a seventh step 106, a device under test to be measured is connected to the measuring device. In an eighth step 107, a measurement uncertainty is determined based upon the results of the verification measurement. Also, parameters of the measurement to be performed on the device under test can be taken into account. In a ninth step 108, the measurement on the device under test is performed. In a tenth step 109, measurement results as well as the measurement uncertainty are displayed on a display unit.

The steps 106, 108 and 109 are optional steps. In accordance with example embodiments, the measurement uncertainty can be determined independent of the actual measurement to be performed on a device under test, and the display of the measurement results and measurement uncertainty.

Also it is important to note that the measurement results of the ninth step 108 my influence the measurement uncertainty determined in the eighth step 107. In this case, the steps 107 and 108 are performed in parallel or in an iterative manner.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A calibration apparatus, for calibration of a measurement device, the calibration device comprising:
   a calibration device configured to calibrate the measurement device;
   a verification device configured to verify the calibration of the measurement device, wherein the verification device is a discrete device separate from the calibration device; and
   a switch configured to switch between a connection of the measurement device to the calibration device and a connection of the measurement device to the verification device.

2. The calibration apparatus of claim 1, wherein the calibration device comprises:
   a through connection; and
   three or more different calibration standards.

3. The calibration apparatus of claim 1, wherein the verification device comprises:
   a verification through connection; and
   at least three different verification standards.

4. The calibration apparatus of claim 3, wherein impedances of the three different verification standards are predefined based on one or more of their geometry and material selection.

5. The calibration apparatus of claim 1, wherein the verification device comprises:
   two attenuators, each of a predefined attenuation; and
   two verification lines, each of a different predefined impedance.

6. The calibration apparatus of claim 5, wherein the attenuations of the two attenuators are predefined based on one or more of their geometry and material selection.

7. A measuring system comprising a measurement device and a calibration apparatus, wherein the calibration apparatus comprises:
a calibration device configured to calibrate the measurement device;
a verification device configured to verify the calibration of the measurement device, wherein the verification device is a discrete device separate from the calibration device; and
a switch configured to switch between a connection of the measurement device to the calibration device and a connection of the measurement device to the verification device.

8. The measuring system according to claim 7, wherein the calibration apparatus is configured to:
perform a calibration measurement on the calibration device, using the measurement device;
calibrate the measurement device based on the calibration measurement;
switch to the verification device by means of the switch; and
perform a verification measurement on the verification device, using the measurement device.

9. The measuring system according to claim 8, wherein the measurement device is configured to, when a measurement on a device under test is to be performed, determine a measurement uncertainty of the measurement to be performed based on results of the verification measurement.

10. The measuring system according to claim 9, wherein the measurement device is configured to, when a measurement on a device under test is to be performed, determine the measurement uncertainty of the measurement to be performed based further on parameters of the measurement to be performed.

11. The measuring system according to claim 9, wherein the measurement device comprises a display unit, and wherein the measurement device is configured to display the measurement uncertainty on the display unit.

12. The measuring system according to claim 9, wherein, when a measurement on a device under test is to be performed, the measurement device is configured to:
perform the measurement;
display measurement results of the measurement on the display as a graph; and
display the measurement uncertainty as one or more of a pattern, color and/or shading, an uncertainty area around the graph, and a shape attached to the graph.

13. The measuring system according to claim 8, wherein the measurement device is configured to calibrate the measurement device based on the calibration measurement, whereby a directivity becomes approximately zero, a source-match becomes approximately zero, and a reflection tracking becomes approximately one.

14. The measuring system according to claim 13, wherein the measurement device is configured to:
determine an effective directivity, an effective source-match, and an effective reflection tracking based on the verification measurement; and
determine the measurement uncertainty based on the effective directivity, the effective source-match, and the effective reflection tracking.

15. A measuring method comprising:
performing, by a calibration device, a calibration measurement using a measurement device;
calibrating the measurement device based on the calibration measurement;
switching a connection of the measurement device from the to a calibration device to a verification device, wherein the verification device is a discrete device separate from the calibration device;
performing, by the verification device, a verification measurement using the measurement device; and
determining a measurement uncertainty of a measurement to be performed on a device under test based on results of the verification measurement.

16. The measuring method according to claim 15, wherein, when a measurement on a device under test is to be performed, the method further comprises:
determining the measurement uncertainty of the measurement to be performed based further on parameters of the measurement to be performed.

17. The measuring method according to claim 15, further comprising:
displaying the measurement uncertainty on a display unit of the measurement device.

18. The measuring method according to claim 15, wherein, when a measurement on a device under test is to be performed, the method further comprises:
performing the measurement;
displaying measurement results of the measurement on a display as a graph; and
displaying the measurement uncertainty as one or more of a pattern, color and/or shading, an uncertainty area around the graph, and a shape attached to the graph.

19. The measuring method according to claim 15, wherein the calibration of the measurement device is based on the calibration measurement, whereby a directivity becomes approximately zero, a source-match becomes approximately zero, and a reflection tracking becomes approximately one.

20. The measuring method according to claim 19, further comprising:
determining an effective directivity, an effective source-match, and an effective reflection tracking based on the verification measurement; and
determining the measurement uncertainty based on the effective directivity, the effective source-match, and the effective reflection tracking.

* * * * *